(12) United States Patent
Ikeda et al.

(10) Patent No.: US 10,332,581 B2
(45) Date of Patent: Jun. 25, 2019

(54) SEMICONDUCTOR MEMORY DEVICE

(71) Applicant: Toshiba Memory Corporation, Minato-ku (JP)

(72) Inventors: Keiji Ikeda, Kawasaki (JP); Chika Tanaka, Fujisawa (JP); Toshinori Numata, Kamakura (JP); Tsutomu Tezuka, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,427

(22) Filed: Mar. 9, 2018

(65) Prior Publication Data

US 2018/0268893 A1 Sep. 20, 2018

(30) Foreign Application Priority Data

Mar. 17, 2017 (JP) ................. 2017-052652

(51) Int. Cl.
| | |
|---|---|
| G11C 7/00 | (2006.01) |
| G11C 11/406 | (2006.01) |
| G11C 11/4094 | (2006.01) |
| G11C 11/403 | (2006.01) |
| G11C 11/408 | (2006.01) |

(52) U.S. Cl.
CPC ...... *G11C 11/40607* (2013.01); *G11C 11/403* (2013.01); *G11C 11/4085* (2013.01); *G11C 11/4094* (2013.01); *G11C 11/40615* (2013.01); *G11C 11/40622* (2013.01); *G11C 2207/2245* (2013.01)

(58) Field of Classification Search
CPC ......... G11C 5/141; G11C 5/143; G11C 5/147; G11C 7/22; G11C 11/413

USPC ................... 365/226, 229, 185.18
See application file for complete search history.

(56) References Cited

U.S. PATENT DOCUMENTS

| | | |
|---|---|---|
| 9,698,272 B1 | 7/2017 | Ikeda et al. |
| 2007/0070683 A1 | 3/2007 | Fuhrmann et al. |
| 2007/0109905 A1 | 5/2007 | Takahashi |

(Continued)

FOREIGN PATENT DOCUMENTS

| | | |
|---|---|---|
| JP | 2007-141286 | 6/2007 |
| JP | 2011-151384 | 8/2011 |

(Continued)

OTHER PUBLICATIONS

Jamie Liu et al., "RAIDR: Retention-Aware Intelligent DRAM Refresh", the 39$^{th}$ Annual International Symposium on Computer Architecture, pp. 1-12, 2012.

(Continued)

*Primary Examiner* — Son T Dinh
(74) *Attorney, Agent, or Firm* — Oblon, McClelland, Maier & Neustadt, L.L.P.

(57) ABSTRACT

According to one embodiment, a semiconductor memory device includes a first memory cell including a first transistor and a first capacitor, a second memory cell including a second transistor and a second capacitor, a first word line electrically coupled to the first transistor, a second word line electrically coupled to the second transistor, and a first circuit which supplies a first voltage to the first word line, and a second voltage different from the first voltage to the second word line, during a sleep mode.

13 Claims, 11 Drawing Sheets

(56) References Cited

U.S. PATENT DOCUMENTS

| | | |
|---|---|---|
| 2011/0156117 A1 | 6/2011 | Yamazaki et al. |
| 2012/0314524 A1 | 12/2012 | Takemura |
| 2014/0362637 A1* | 12/2014 | Jeong .................. G11C 8/08 365/149 |
| 2017/0271341 A1 | 9/2017 | Tanaka et al. |

FOREIGN PATENT DOCUMENTS

| | | |
|---|---|---|
| JP | 2013-016246 | 1/2013 |
| JP | 2017-168622 | 9/2017 |
| JP | 2017-168623 | 9/2017 |

OTHER PUBLICATIONS

Giovanni Cherubini et al., "Cognitive Storage for Big Data", IEEE Computer, No. 3, pp. 43-51, 2016.

* cited by examiner

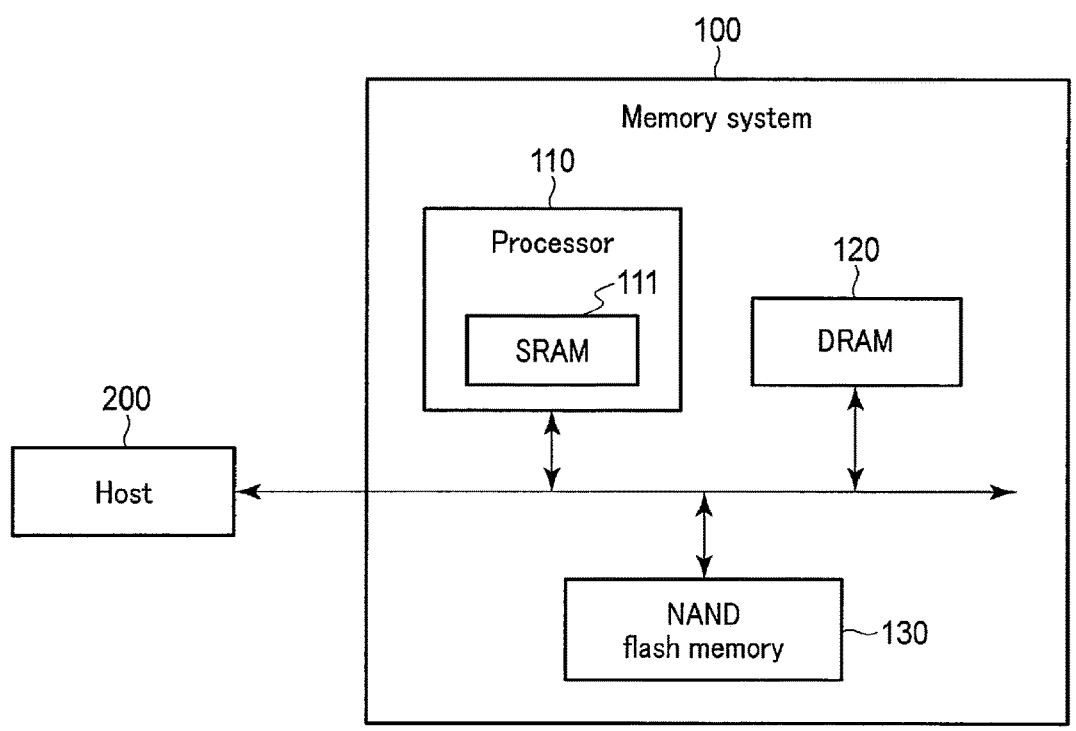
F I G. 1

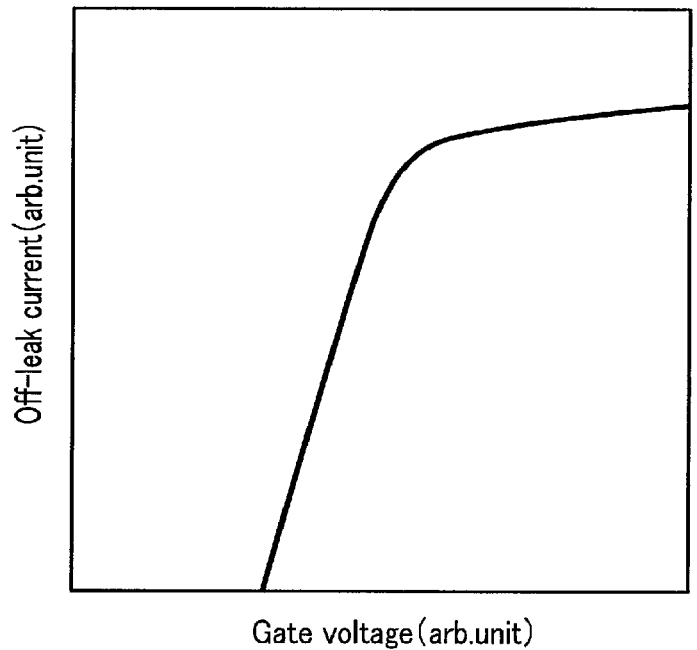
F I G. 4
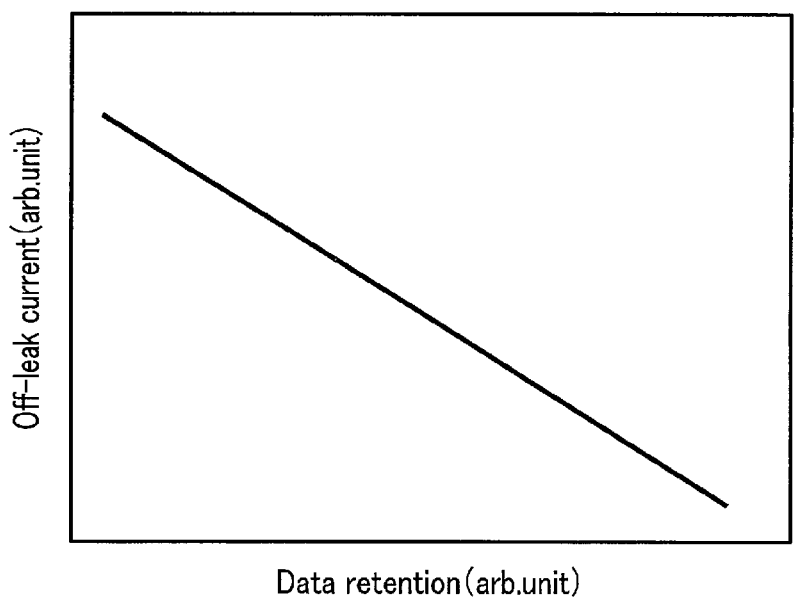
F I G. 5

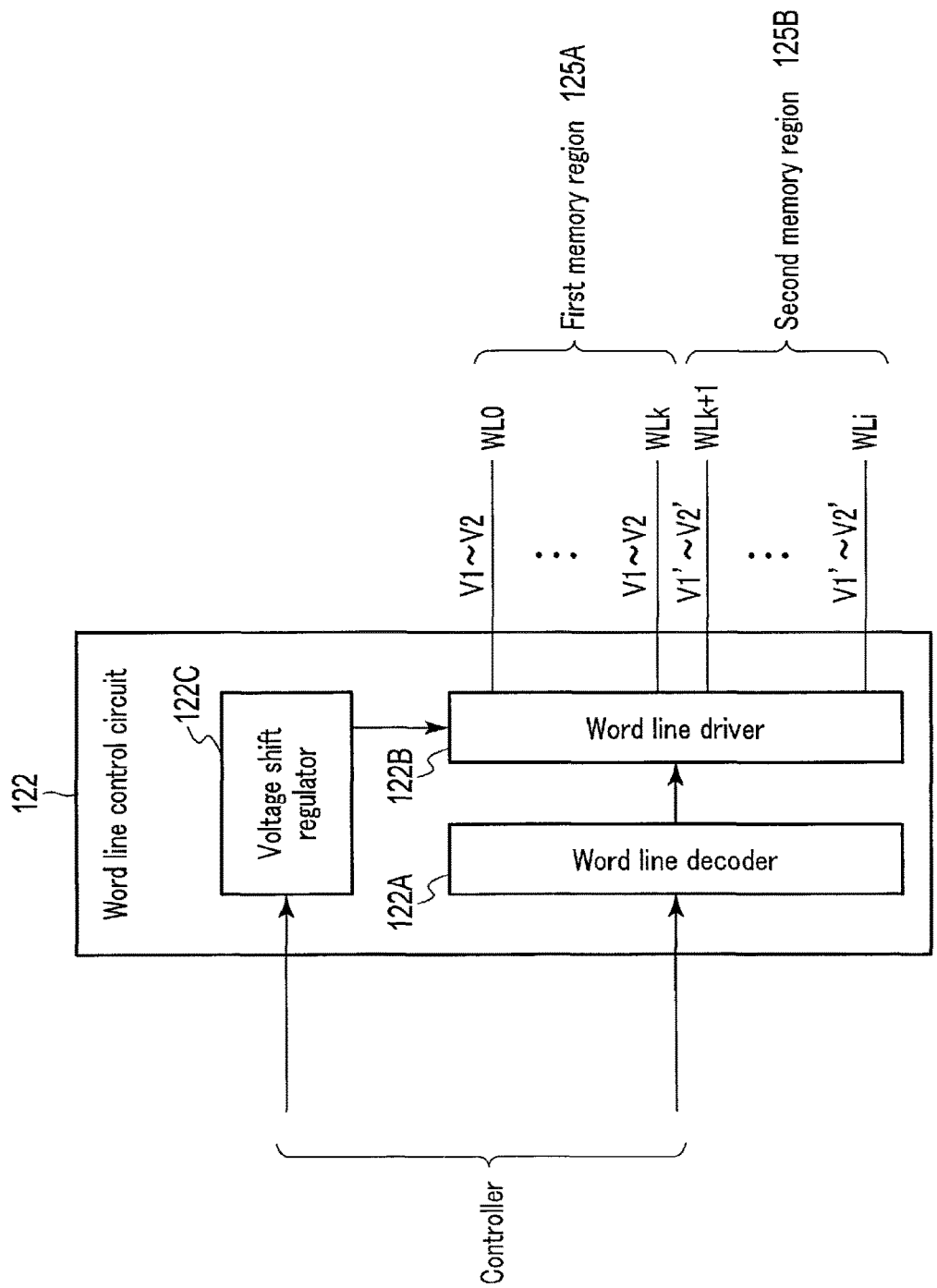
F I G. 6

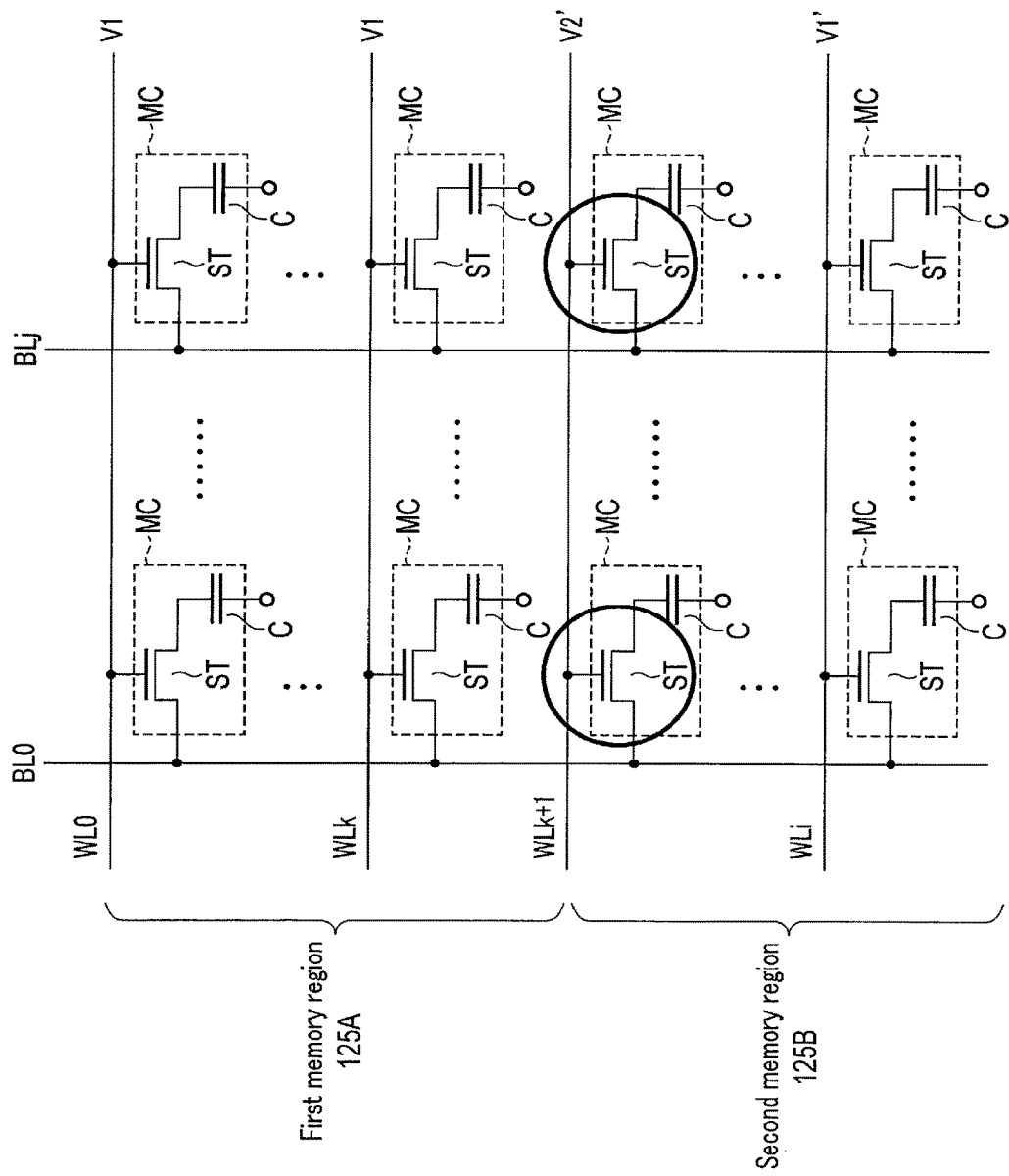
F I G. 9

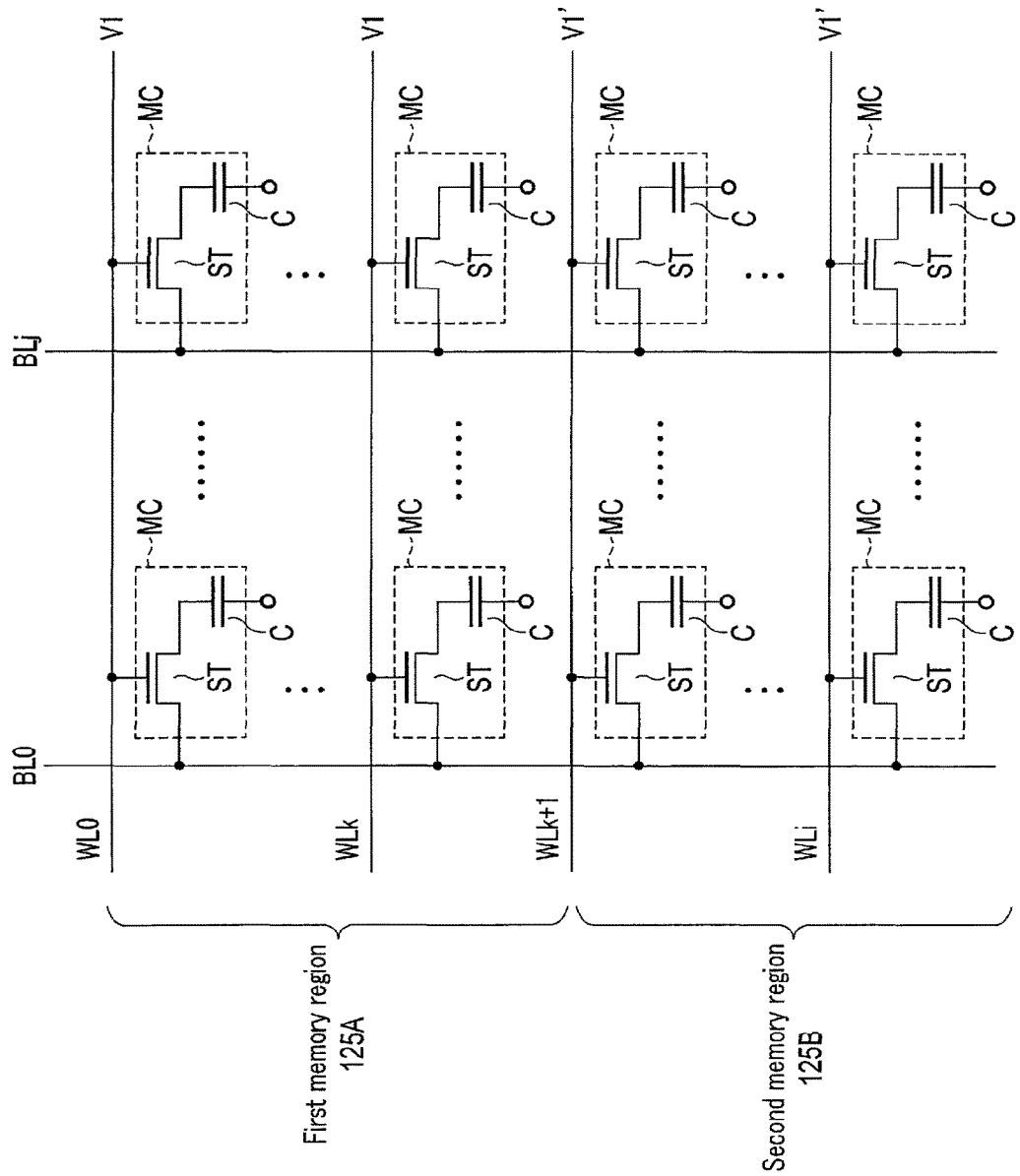
F I G. 10

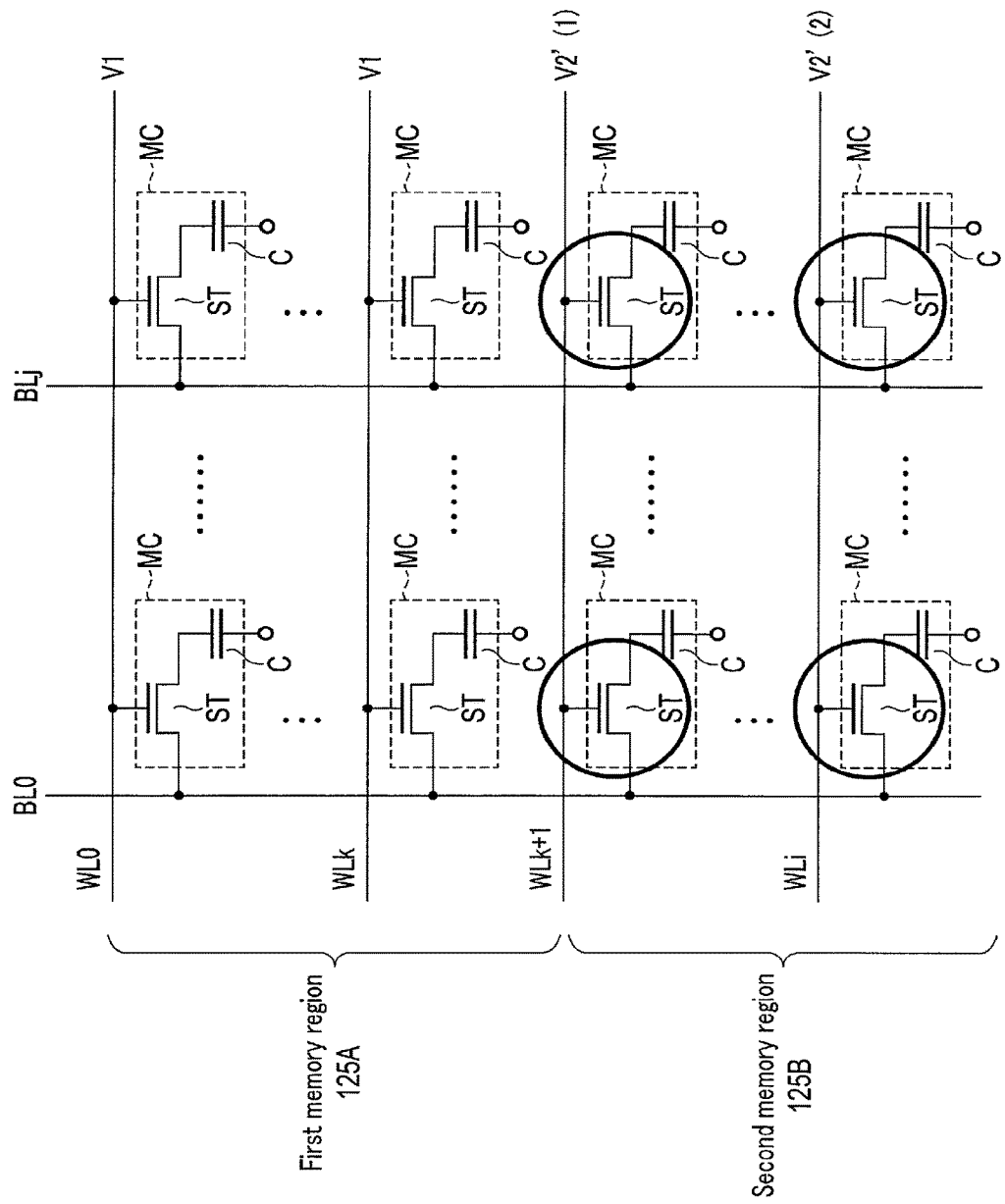
F.I.G. 12

SEMICONDUCTOR MEMORY DEVICE

CROSS-REFERENCE TO RELATED APPLICATIONS

This application is based upon and claims the benefit of priority from the prior Japanese Patent Application No. 2017-052652, filed Mar. 17, 2017, the entire contents of which are incorporated herein by reference.

FIELD

Embodiments described herein relate generally to a semiconductor memory device.

BACKGROUND

A memory system has a memory hierarchical structure. The memory hierarchical structure includes memories having different operation speeds. More specifically, the memory hierarchical structure includes an SRAM (static random access memory), a DRAM (Dynamic Random Access Memory, a NAND flash memory and others in the order of high operation speed. These memories are different from each other in the data retention as well as the operation speed. When data transmission is carried out between memories having different data retentions, an overhead resultantly occurs. Therefore, it is desired that a wide range of the system is covered with the DRAM to simplify the memory hierarchical structure and to decrease in the overhead.

However, the use of the conventional DRAM cannot arbitrarily set the data retention and operation speed. Thus, it has been impossible to solve the problem in the memory hierarchical structure.

BRIEF DESCRIPTION OF THE DRAWINGS

FIG. 1 is a view showing a memory system including a semiconductor memory device according to an embodiment;

FIG. 4 is a view showing a relationship between a gate voltage of a selection transistor and an off-leak current of the selection transistor in the semiconductor memory device according to the embodiment;

FIG. 5 is a view showing a relationship between data retention of a memory cell and an off-leak current of the selection transistor in the semiconductor memory device according to the embodiment;

FIG. 6 is a view showing a word line control circuit in the semiconductor memory device according to the embodiment;

FIG. 9 is a view showing the writing operation in a second memory region in the semiconductor memory device according to the embodiment;

FIG. 10 is a view showing a sleep mode of the first memory region and the second memory region in the semiconductor memory device according to the embodiment;

FIG. 12 is a view showing refresh in the second memory region in the semiconductor memory device according to the embodiment.

DETAILED DESCRIPTION

Figure 2:
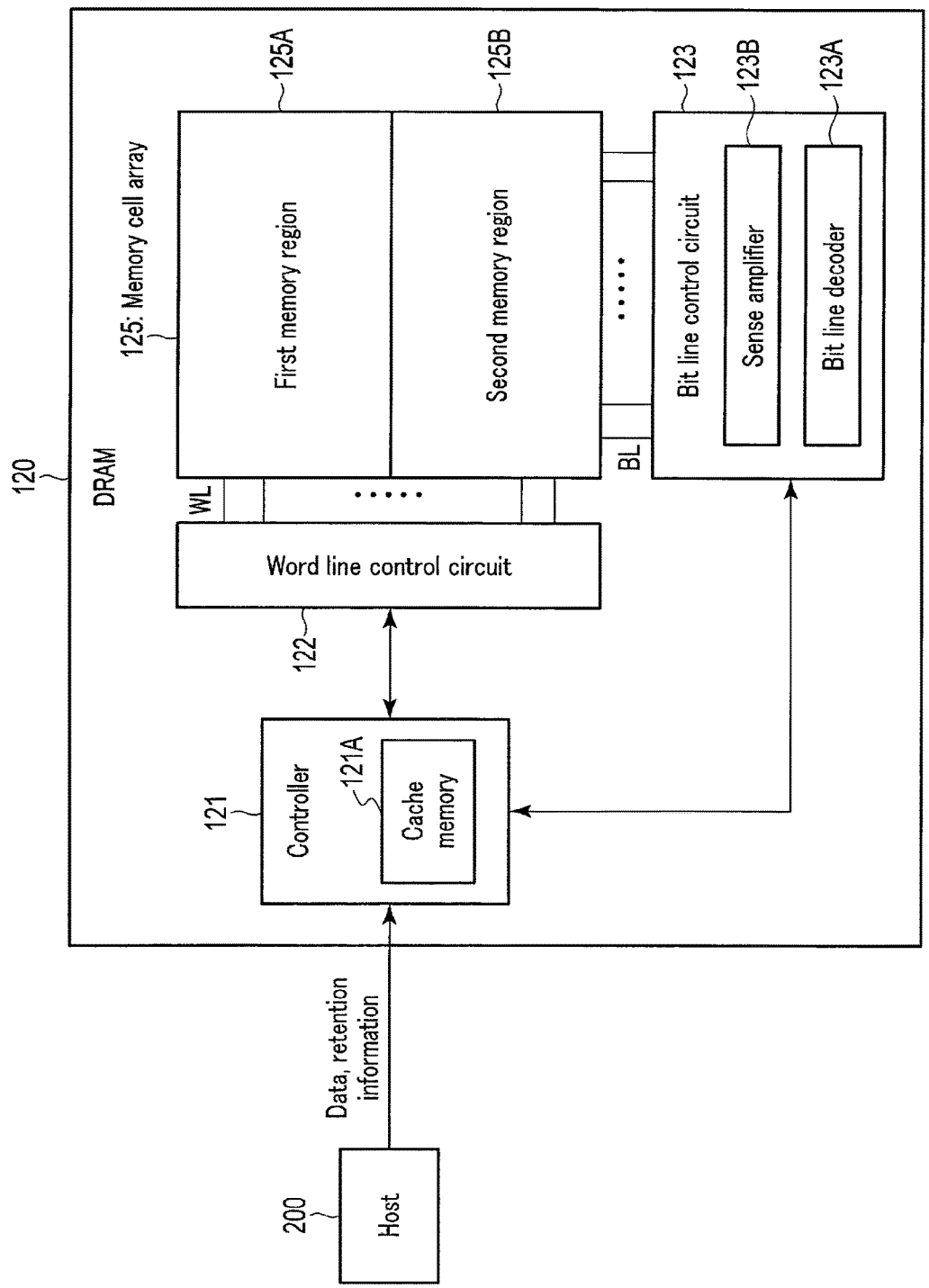
FIG. 2 is a view showing the semiconductor memory device according to the embodiment.

In general, according to one embodiment, a semiconductor memory device includes a first memory cell including a first transistor and a first capacitor, a second memory cell including a second transistor and a second capacitor, a first word line electrically coupled to the first transistor, a second word line electrically coupled to the second transistor, and a first circuit which supplies a first voltage to the first word line, and a second voltage different from the first voltage to the second word line, during a sleep mode.

The embodiment will hereinafter be described with reference to drawings. In the drawings, the same members are attached with the same reference signs.

Embodiment

A semiconductor memory device according to an embodiment will now be described hereinafter with reference to FIG. 1 to FIG. 12. A case where the semiconductor memory device is a DRAM will be described below. Further, in the following description, "coupling" means not only a case where direct coupling is performed but also a case where coupling is performed through an arbitrary element. Furthermore, a first terminal of a transistor represents a one of a source and a drain, and a second terminal of the transistor represents the other of the source and the drain. Moreover, a control terminal of the transistor represents a gate.

Structural Example

First, a structural example of a semiconductor memory device according to an embodiment will be described.

FIG. 1 is a view showing a memory system 100 including a semiconductor memory device (a DRAM) according to the embodiment.

As shown in FIG. 1, the memory system 100 includes a processor 110, a DRAM 120, and a NAND flash memory 130.

The processor 110 controls an entire operation of the memory system 100. The processor 110 includes an SRAM 111. The SRAM 111 functions as a buffer in the processor 110. The DRAM 120 functions as a working memory of the processor 110. The NAND flash memory 130 stores user data in a nonvolatile manner. The processor 110, the DRAM 120, and the NAND flash memory 130 are electrically coupled to a host 200 through a bus.

As will be described later, in the DRAM 120 in this embodiment, data retention and an operating speed can be arbitrarily set. Thus, a part of the DRAM 120 may be used as a working memory and may be used in place of the SRAM 111 or the NAND flash memory 130.

FIG. 2 is a view showing a semiconductor memory device according to an embodiment.

As shown in FIG. 2, the DRAM 120 includes a controller 121, a word line control circuit 122, a bit line control circuit 123, and a memory cell array 125.

The memory cell array 125 includes a first memory region 125A and a second memory region 125B. The first memory region 125A and the second memory region 125E are different from each other in data retention. Additionally, the first memory region 125A and the second memory region 125B are different from each other in operating speed (e.g., a writing operating speed). More specifically, for example, the data retention of the first memory region 125A is higher than the data retention of the second memory region 125B. On the other hand, the operating speed of the first memory region 125A is lower than the operating speed of the second memory region 125B. Thus, for example, the first memory region 125A stores data having a higher level of importance than that of the second memory region 125B.

Figure 3:
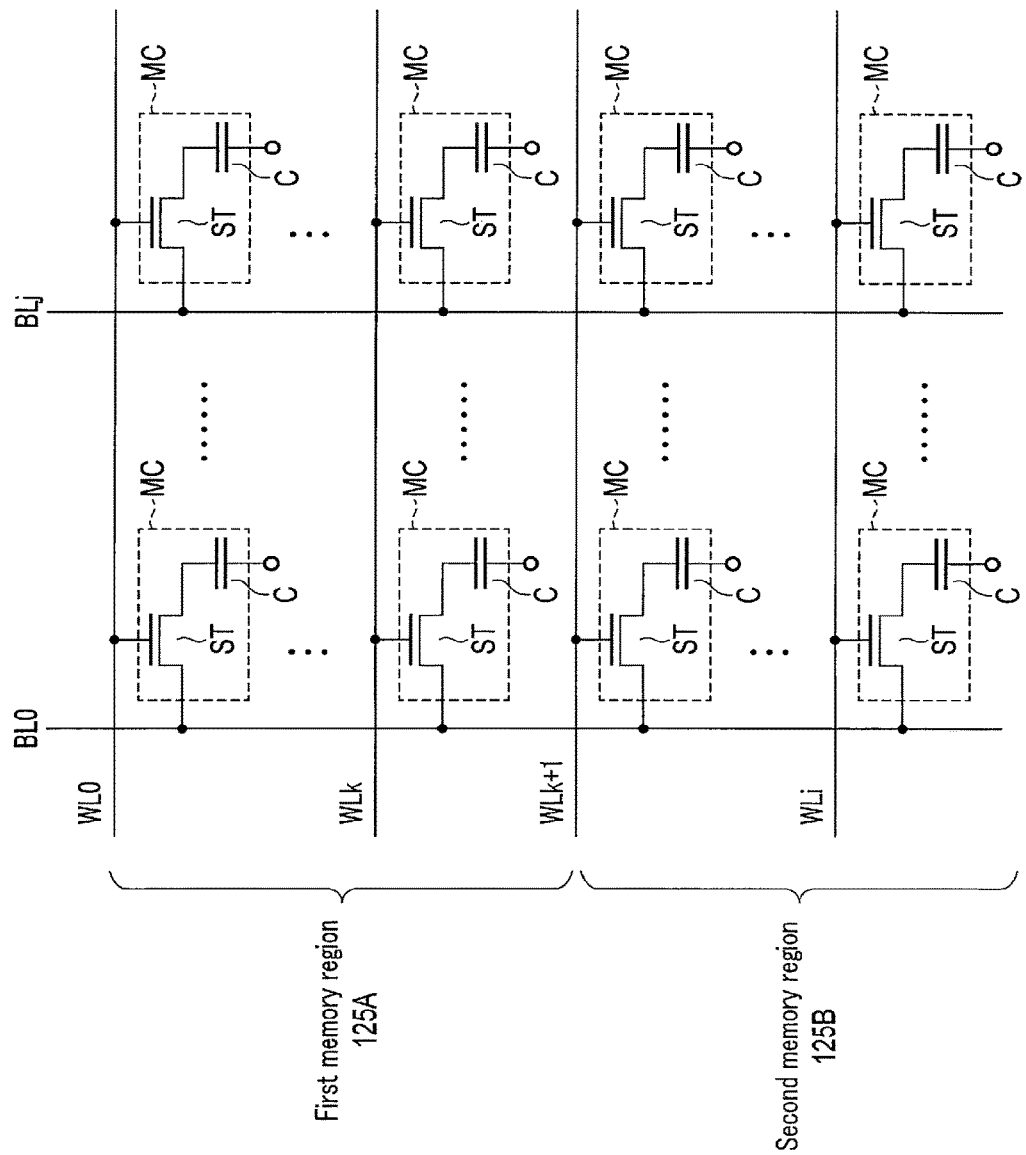
FIG. 3 is a view showing a memory cell array in the semiconductor memory device according to the embodiment.

FIG. 3 is a view showing the memory cell array 125 in the semiconductor memory device according to the embodiment.

As shown in FIG. 3, the memory cell array 125 includes bit lines BL (BL0 to BLj), word lines WL (WL0 to WLi), and memory cells MC.

The bit lines BL0 to BLj are extended in a first direction and aligned in a second direction crossing the first direction. The word lines WL0 to WLi are extended in the second direction and aligned in the first direction. The memory cells MC are provided at crossing portions of the bit lines BL0 to BLj and the word lines WL0 to WLi, respectively. That is, the memory cells MC are arranged in a matrix.

Each of the memory cells MC includes a selection transistor ST and a capacitor C. A first terminal of the selection transistor ST is electrically coupled to any one of the bit lines BL0 to BLj. A control terminal of the selection transistor ST is electrically coupled to any one of the word lines WL0 to WLi. A second terminal of the selection transistor ST is electrically coupled to a first terminal of the capacitor C. A second terminal of the capacitor C is electrically coupled to a ground terminal.

Here, for example, the first memory region 125A includes the memory cells MC electrically coupled to the word lines WL0 to WLk, and the second memory region 125B includes the memory cells MC electrically coupled to the word lines WLk+1 to WLi. That is, the first memory region 125A and the second memory region 125B are divided in units of word lines (here, the word lines WL0 to WL1 and the word lines WLk+1 to WLi).

It is to be noted that the division of the first memory region 125A and the second memory region 125B is not restricted to the above example. The number of the word lines WL in each of the first memory region 125A and the second memory region 125B is arbitrary. Further, the division is not restricted to two, i.e., the first memory region 125A and the second memory region 125B, and division into three or more regions is possible.

FIG. 4 is a view showing a relationship between a gate voltage of the selection transistor ST and an off-leak current of the selection transistor ST in the semiconductor memory device according to the embodiment. FIG. 5 is a view showing a relationship between data retention of the memory cell MC and the off-leak current of the selection transistor ST in the semiconductor memory device according to the embodiment.

In this example, a channel of the selection transistor ST includes an oxide semiconductor. The oxide semiconductor channel has extremely low leak characteristics. That is, as shown in FIG. 4, when the gate voltage of the selection transistor ST is reduced, the off-leak current is extremely decreased. When the off-leak current of the selection transistor ST can be decreased, the data retention of the memory cell MC can be increased as shown in FIG. 5. Thus, in this example, when the gate voltage (an OFF voltage) of the selection transistor in a sleep mode is reduced, the data retention of the memory cell MC can be increased.

The controller 121 controls various operations of the word line control circuit 122 and the bit line control circuit 123 in accordance with a command from the host 200. The controller 121 includes a cache memory 121A. The host 200 transmits retention information of writing data together with the writing data to the controller 121 during writing. The retention information is information indicative of a period during which the writing data should be held. The cache memory 121A stores address information of the writing data, word line setting voltage information, and refresh cycle information based on the writing data and the retention information from the host 200.

Here, the address information of the writing data is information indicative of an address of the writing data, and it is, e.g., information indicating in which one of the first memory region 125A and the second memory region 125B the writing data is to be written. The word line setting voltage information is information indicative of a voltage supplied to the word lines WL (WL to WLk) in the first memory region 125A and a voltage supplied to the word lines WL (WLk+1 to WLi) in the second memory region 125B during the sleep mode. Further, the refresh cycle information is information indicative of a cycle of refresh which is performed to the memory cells MC in the first memory region 125A and a cycle of refresh which is performed to the memory cells MC in the second memory region 125B.

The data retention (e.g., one year) of the memory cells MC is determined by the voltage supplied to the word lines WL during the sleep mode. Furthermore, the cycle of the refresh is set to a cycle which is not greater than the data retention (e.g., a half year) of the memory cells MC. Consequently, data in the memory cells MC is guaranteed in a substantially nonvolatile manner (e.g., a half year).

As shown in FIG. 2, the bit line control circuit 123 includes a bit line decoder 123A and a sense amplifier 123B. The bit line decoder 123A selects a bit line BL in accordance with control of the controller 121. The sense amplifier 123B detects data stored in the memory cells MC based on a voltage in the selected bit line BL. Furthermore, the sense amplifier 123E pre-charges the bit line BL to a predetermined voltage.

FIG. 6 is a view showing the word line control circuit 122 in the semiconductor memory device according to the embodiment.

As shown in FIG. 6, the word line control circuit 122 includes a word line decoder 122A, a word line driver 122B, and a voltage shift regulator 122C.

The word line decoder 122A selects a word line WL in accordance with control of the controller 121. The word line driver 122E supplies a predetermined voltage to the selected word line WL. The voltage shift regulator 122C shifts a voltage level of a power supply voltage, and regulates a voltage range supplied to the word lines WL.

More specifically, the voltage shift regulator 122C regulates the voltage range supplied to the first memory region 125A and the second memory region 125B based on the address information and the word line setting voltage information in the cache memory 121A. The word line driver 122B supplies the voltage regulated by the voltage shift regulator 122C to the word lines WL. Here, the word line driver 122B supplies voltages V1 to V2 to the word lines WL0 to WLk in the first memory region 125A, and supplies voltage V1' to V2' to the word lines WLk+1 to WLi in the second memory region 125B (V1'>V1, V2'>V2). The voltage V1 is, e.g., a negative voltage.

That is, the word line driver 122B supplies the voltage V2 as an ON voltage of the selection transistors ST to the word lines WL0 to WLk in the first memory region 125A, and supplies the voltage V1 as an OFF voltage to the same. On the other hand, the word line driver 122E supplies the voltage V2' as the ON voltage of the selection transistors ST to the word lines WLk+1 to WLi in the second memory region 125B, and supplies the voltage V1' as the off voltage to the same.

It is to be noted that voltage ranges of the voltages V1 to V2 and the voltages V1' to V2' are fixed (V2−V1=V2'−V1'). Thus, the voltage ranges are set low in case of giving priority to the data retention of the writing data, and they are set high in case of giving priority to the writing speed of the writing data.

Operation Sequence Example

An operation sequence example of the semiconductor memory device according to the embodiment will now be described.

Figure 7:
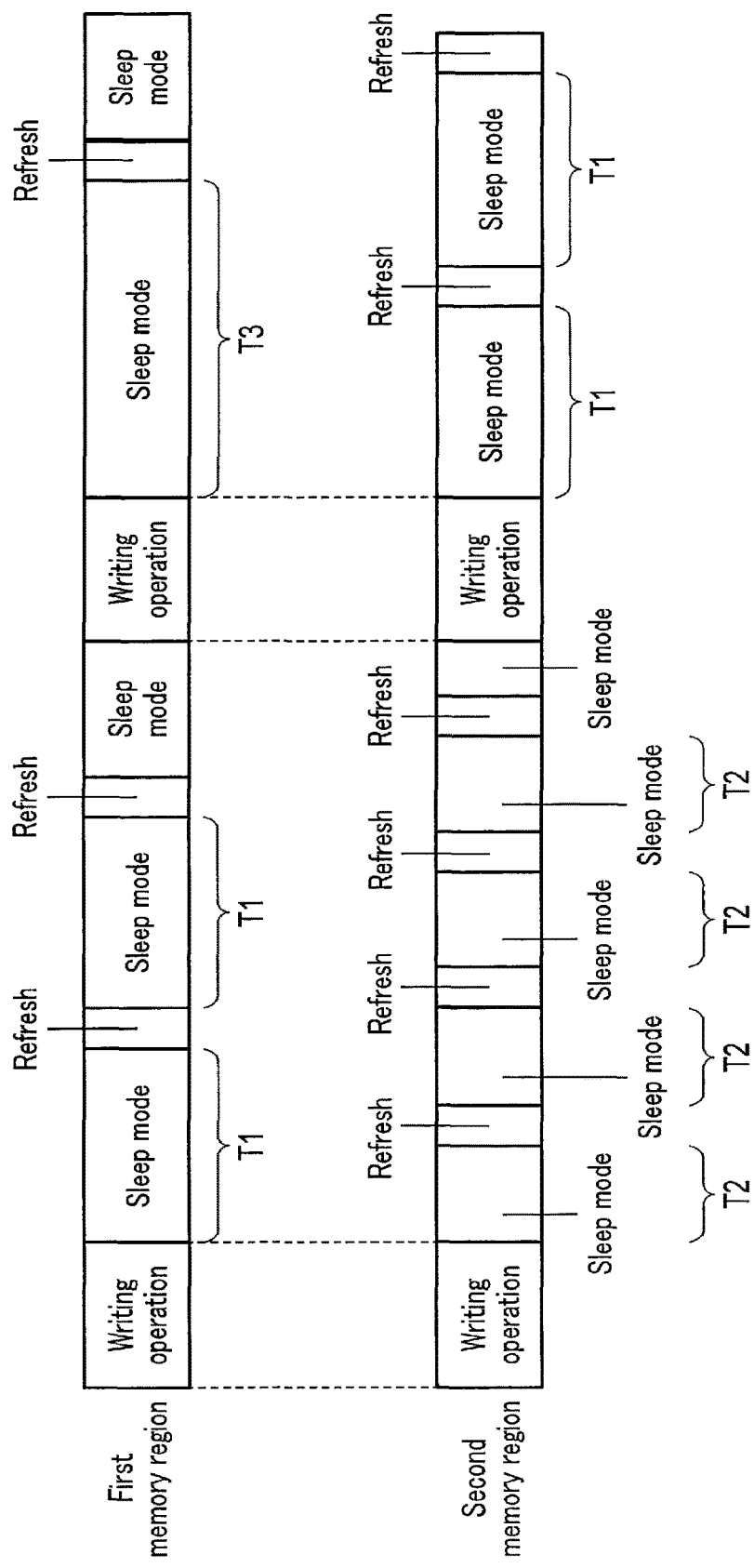
FIG. 7 is a view showing an operation sequence of the semiconductor memory device according to the embodiment.

FIG. 7 is a view showing an operation sequence of the semiconductor memory device according to the embodiment.

Here, the drawing shows a sequence in which, in the first memory region 125A and the second memory region 125B, a writing operation is performed and then the sleep mode begins. The refresh is periodically performed during the sleep mode. Here, the sleep mode represents a period during which data is held in an operation other than various operations, e.g., writing, reading, or erasing, and also represents a period during which power in the system is OFF. Moreover, in the first memory region 125A, the refresh is performed in a cycle T1, and then the cycle is dynamically changed to a cycle T3 (>T1) while performing data rewriting (a second writing operation). On the other hand, in the second memory region 125B, the refresh is performed in a cycle T2 (<T1), and then the cycle is dynamically changed to the cycle T1 while performing data rewriting. The operation sequence will now be described hereinafter in detail.

First, as shown in FIG. 7, in the first memory region 125A and the second memory region 125B, the writing operation is performed. This writing operation is an example where data from the host 200 is written in both the first memory region 125A and the second memory region 125B. At this time, first, the host 200 transmits writing data as well as retention information to the controller 121. The controller 121 sets address information of this writing data based on the writing data from the host 200, and stores the address information in the cache memory 121A. Additionally, the controller 121 sets word line setting voltage information and refresh cycle information based on the retention information from the host 200, and stores the word line setting voltage information and the refresh cycle information in the cache memory 121A.

Here, as the word line setting voltage information, the voltage (the OFF voltage) V1 which is supplied to the word lines WL in the first memory region 125A during the sleep mode and the voltage V1' (the OFF voltage) which is supplied to the word lines WL in the second memory region 125B during the sleep mode are stored. Further, as the refresh cycle information, the cycle T1 of the refresh to the memory cells MC in the first memory region 125A and the cycle T2 of the refresh to the memory cells MC in the second memory region 125B are stored.

Furthermore, when the OFF voltages of the selection transistors are set to the voltages V1 and V1', the voltage (the ON voltage) V2 which is supplied to the word lines WL in the first memory region 125A during the writing operation and the voltage (the ON voltage) V2' which is supplied to the word lines WL in the second memory region 125B during the writing operation are set. That is, the voltages V1 to V2 can be supplied to the word lines WL in the first memory region 125A in various operations, and the voltages V1' to V2' can be supplied to the word lines WL in the second memory region 125B in various operations.

It is to be noted that predetermined voltages are sequentially supplied to the bit lines BL0 to BLj in various operations, but this point will be omitted in the following description.

Figure 8:
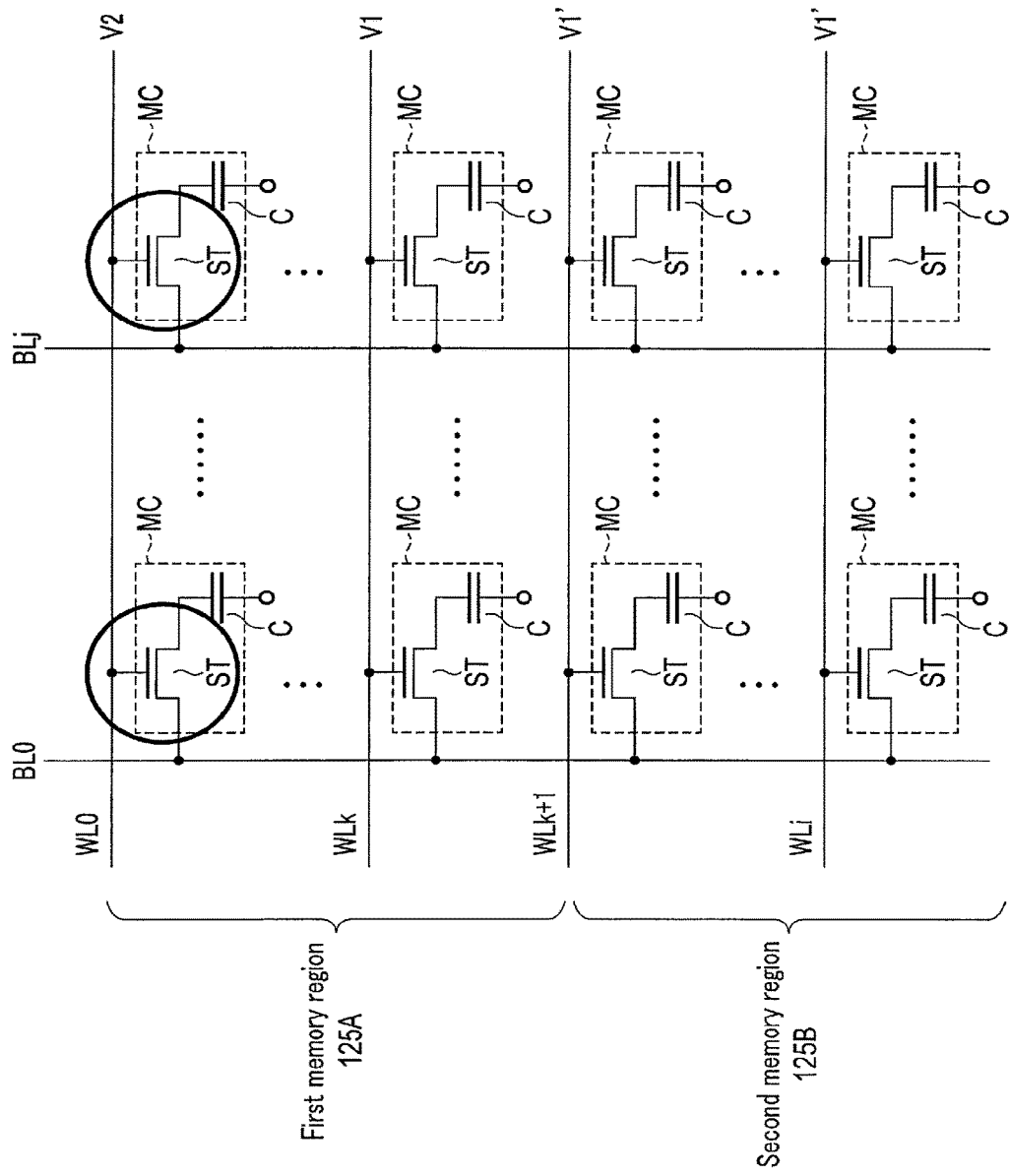
FIG. 8 is a view showing a writing operation in a first memory region in the semiconductor memory device according to the embodiment.

FIG. 8 is a view showing the writing operation in the first memory region 125A in the semiconductor memory device according to the embodiment. FIG. 9 is a view showing the writing operation in the second memory region 125B in the semiconductor memory device according to the embodiment. FIG. 8 shows writing to the memory cells MC electrically coupled to the word line WL0, and FIG. 9 shows writing to the memory cells MC electrically coupled to the word line WLk+1.

As shown in FIG. 8, during writing data in the first memory region 125A, the word line control circuit 122 supplies the voltage V2 to the selected word line WL0 in the first memory region 125A based on the word line setting voltage information. Furthermore, the word line control circuit 122 supplies the voltage V1 to the non-selected word lines WL1 to WLk in the first memory region 125A based on the word line setting voltage information. Moreover, the word line control circuit 122 supplies the voltage V1' to the non-selected word lines WLk+1 to WLi in the second memory region 125B based on the word line setting voltage information. Consequently, the selection transistors ST electrically coupled to the selected word line WL0 are turned on, and writing is performed in the memory cells MC including the selection transistors ST which have been turned on. On the other hand, the selection transistors ST electrically coupled to the non-selected word lines WL1 to WLi are turned off.

As shown in FIG. 9, during writing data in the second memory region 125B, the word line control circuit 122 supplies the voltage V2' to the selected word line WLk+1 in the second memory region 125B based on the word line setting voltage information. Additionally, the word line control circuit 122 supplies the voltage V1' to the non-selected word lines WLk+2 to WLi in the second memory region 125B based on the word line setting voltage information. Further, the word line control circuit 122 supplies the voltage V1 to the non-selected word lines WL0 to WLk in the first memory region 125A based on the word line setting voltage information. Consequently, the selection transistors ST electrically coupled to the selected word line WLk+1 are turned on, and writing is performed in the memory cells MC including the selection transistors ST which have been turned on. On the other hand, the selection transistors ST electrically coupled to the non-selected word lines WL0 to WLk and WLk+2 to WLi are turned off.

Here, the voltage V2' during writing in the second memory region 125B is larger than the voltage V2 during writing in the first memory region 125A. Thus, a writing operation speed in the second memory region 125B is higher than a writing operation speed in the first memory region 125A.

Then, as shown in FIG. 7, the first memory region 125A and the second memory region 125B enter the sleep mode.

FIG. 10 is a view showing the sleep mode of the first memory region 125A and the second memory region 125B in the semiconductor memory device according to the embodiment.

As shown in FIG. 10, during the sleep mode, the word line control circuit 122 supplies the voltage V1 to the word lines WL0 to WLk in the first memory region 125A based on the word line setting voltage information. On the other hand, during the sleep mode, the word line control circuit 122 supplies the voltage V1' to the word lines WLk+1 to WLi in the second memory region 125B based on the word line setting voltage information. Consequently, the selection transistors ST electrically coupled to the all the word lines WL0 to WLi are turned off.

Here, the voltage V1' in the second memory region 125B during the sleep mode is larger than the voltage V1 in the first memory region 125A during the sleep mode. Thus, the off-leak current from the memory cells MC in the second memory region 125B is larger than the off-leak current from the memory cells MC in the first memory region 125A. That is, the data retention of the first memory region 125A is higher than the data retention of the second memory region 125B.

Thus, as shown in FIG. 7, during the sleep mode, the refresh is performed in the first memory region 125A in the cycle T1 based on the refresh cycle information, and the refresh is performed in the second memory region 125B in the cycle T2 based on the refresh cycle information.

Figure 11:
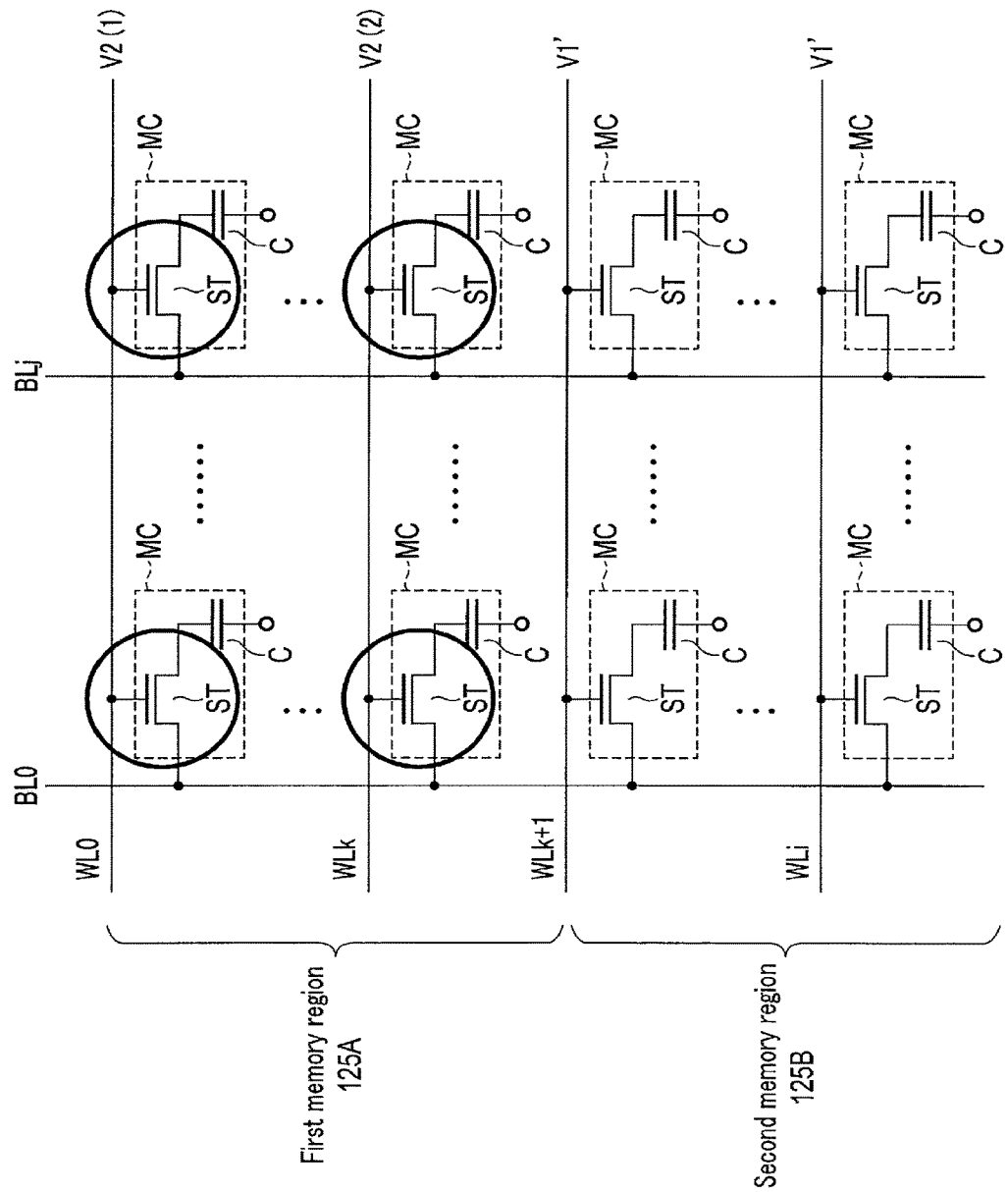
FIG. 11 is a view showing refresh of the first memory region in the semiconductor memory device according to the embodiment.

FIG. 11 is a view showing the refresh in the first memory region 125A in the semiconductor memory device according to the embodiment.

As shown in FIG. 11, during refresh in the first memory region 125A, the word line control circuit 122 sequentially supplies the voltage V2 to the word lines WL0 to WLk in the first memory region 125A based on the word line setting voltage information. Consequently, the selection transistors ST electrically coupled to the word lines WL0 to WLk are sequentially turned on, and the refresh is performed to the memory cells MC including the selection transistors ST which have been turned on. Additionally, the word line control circuit 122 supplies the voltage V1' to the word lines WLk+1 to WLi in the second memory region 125B based on the word line setting voltage information. Consequently, the selectin transistors ST electrically coupled to the word lines WLk+1 to WLi are turned off.

FIG. 12 is a view showing the refresh in the second memory region 125B in the semiconductor memory device according to the embodiment.

As shown in FIG. 12, during refresh in the second memory region 125B, the word line control circuit 122 sequentially supplies the voltage V2' to the word lines WLk+1 to WLi in the second memory region 125B based on the word line setting voltage information. Consequently, the selection transistors ST electrically coupled to the word lines WLk+1 to WLi are sequentially turned on, and the refresh is performed to the memory cells MC including the selection transistors ST which have been turned on. Furthermore, the word line control circuit 122 supplies the voltage V1 to the word lines WL0 to WLk in the first memory region 125A based on the word line setting voltage information. Consequently, the selection transistors ST electrically coupled to the word lines WL0 to WLk are turned off.

Then, as shown in FIG. 7, in the first memory region 125A and the second memory region 125B, a second writing operation is performed. This writing operation is an example where data from the host 200 is written in the first memory region 125A only. At this time, first, the host 200 transmits the retention information together with the writing data to the controller 122. On the other hand, previously written data in the first memory region 125A is rewritten in the second memory region 125B. The controller 121 resets the address information of the writing data based on the writing data from the host 200, and stores the address information in the cache memory 121A. Furthermore, the controller 121 resets the word line setting voltage information and the refresh cycle information based on the retention information from the host 200, and stores the word line setting voltage information and the refresh cycle information in the cache memory 121A.

At this time, even if the retention information from the host 200 is not present, the address information, the word line setting voltage information, and the refresh cycle information are reset based on the information which has been already stored in the cache memory 121.

Here, as the word line setting voltage information, a voltage (the OFF voltage) V3 (<V1) which are supplied to the word lines WL in the first memory region 125A during the sleep mode and the voltage (the OFF voltage) V1 which are supplied to the word lines WL in the second memory region 125B during the sleep mode are stored. Further, as the refresh cycle information, the cycle T3 (>T1) of the refresh to the memory cells MC in the first memory region 125A and the cycle T1 of the refresh to the memory cells MC in the second memory region 125E are stored.

Furthermore, when the off voltages of the selection transistors ST are set to the voltages V3 and V1, a voltage (the ON voltage) V4 (<V2) which is supplied to the word lines WL in the first memory region 125A in the writing operation and the voltage (the ON voltage) V2 which is supplied to the word lines WL in the second memory region 125B in the writing operation are set. That is, the voltages V3 to V4 can be supplied to the word lines WL in the first memory region 125A in various operations, and the voltages V1 to V2 can be supplied to the word lines WL in the second memory region 125B in various operations.

Then, in the first memory region 125A, the voltage V4 is supplied to the selected word line WL during writing, and the voltage V3 is supplied to the non-selected word lines WL. Moreover, in the first memory region 125A, the refresh is performed during the sleep mode in the cycle T3. Additionally, in the first memory region 125A, the voltage V3 is supplied to the word lines WL during the sleep mode. Further, in the first memory region 125A, the voltage V4 is sequentially supplied to the word lines WL during refresh.

On the other hand, in the second memory region 125B, since the data previously written in the first memory region 125A is rewritten, the same foregoing operation in the first memory region 125A is performed.

[Effect]

According to the foregoing embodiment, the controller 121 includes the cache memory 121A. The cache memory 121A stores the address information of the writing data, the word line setting voltage information, and the refresh cycle information based on the writing data and the retention information from the host 200. The voltages of the word lines and the refresh cycle in each memory region can be set based on these pieces of information. Consequently, in each memory region, the data retention can be arbitrarily set.

Further, in addition to the voltage (the OFF voltage) of the word lines during refresh in each memory region, the voltage (the ON voltage) of the selected word line during writing in each memory region can be set. Consequently, in each memory region, the writing operation speed can be arbitrarily set.

As described above, arbitrarily setting the data retention and the writing operation speed of each memory region in the DRAM 120 enables using the DRAM 120 as a wide-range memory of the memory system 100. That is, in place of the NAND flash memory 130 and the SRAM 111, the DRAM 120 can be used. Consequently, a memory hierarchical structure in the memory system 100 can be simplified, and costs of the memory system 100 can be reduced. Furthermore, it is possible to minimize an overhead associated with data transfer between memories which are different from each other in data retention in the memory system 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
a first memory cell including a first transistor and a first capacitor;
a second memory cell including a second transistor and a second capacitor;
a first word line electrically coupled to the first transistor;
a second word line electrically coupled to the second transistor; and
a first circuit which supplies a first voltage to the first word line, and a second voltage different from the first voltage to the second word line, during a sleep mode.

2. The device of claim 1, further comprising a controller which stores information of the first voltage supplied to the first word line during the sleep mode and information of the second voltage supplied to the second word line during the sleep mode.

3. The device of claim 2,
wherein the controller stores information of a first refresh cycle of the first memory cell and information of a second refresh cycle of the second memory cell.

4. The device of claim 3,
wherein the first circuit performs refresh to the first memory cell in a first cycle based on the information of the first refresh cycle, and performs refresh to the second memory cell in a second cycle different from the first cycle based on the information of the second refresh cycle.

5. The device of claim 1,
wherein, during a writing, the first circuit supplies a third voltage to the first word line when the first memory cell is a writing target, and supplies a fourth voltage different from the third voltage to the second word line when the second memory cell is a writing target.

6. The device of claim 2,
wherein, during a writing, the controller sets and stores the information of the first voltage and the information of the second voltage based on writing data from the outside and retention information of the writing data.

7. The device of claim 3,
wherein, during a writing, the controller sets and stores the information of the first refresh cycle and the information of the second refresh cycle based on writing data from the outside and retention information of the writing data.

8. A semiconductor memory device comprising:
a first memory cell including a first transistor and a first capacitor;
a second memory cell including a second transistor and a second capacitor;
a first word line electrically coupled to the first transistor;
a second word line electrically coupled to the second transistor;
a first circuit which supplies a voltage in a first range to the first word line, and supplies a voltage in a second range different from the first range to the second word line; and
a controller which stores information of a first voltage supplied to the first word line during a sleep mode and information of a second voltage supplied to the second word line during the sleep mode.

9. The device of claim 8,
wherein the controller stores information of a first refresh cycle of the first memory cell and information of a second refresh cycle of the second memory cell.

10. The device of claim 9,
wherein the first circuit performs refresh to the first memory cell in a first cycle based on the information of the first refresh cycle, and performs refresh to the second memory cell in a second cycle different from the first cycle based on the information of the second refresh cycle.

11. The device of claim 8,
wherein, during a writing, the first circuit supplies a third voltage to the first word line when the first memory cell is a writing target, and supplies a fourth voltage different from the third voltage to the second word line when the second memory cell is a writing target.

12. The device of claim 8,
wherein, during a writing, the controller sets and stores the information of the first voltage and the information of the second voltage based on writing data from the outside and retention information of the writing data.

13. The device of claim 9,
wherein, during a writing, the controller sets and stores the information of the first refresh cycle and the information of the second refresh cycle based on writing data from the outside and retention information of the writing data.

* * * * *